(12) United States Patent
Horiuchi

(10) Patent No.: US 8,193,014 B2
(45) Date of Patent: Jun. 5, 2012

(54) MANUFACTURING METHOD OF LIGHT-EMITTING DIODE

(75) Inventor: Megumi Horiuchi, Minamitsuru-gun (JP)

(73) Assignees: Citizen Electronics Co., Ltd., Yamanashi (JP); Citizen Holdings Co., Ltd., Tokyo (JP)

( * ) Notice: Subject to any disclaimer, the term of this patent is extended or adjusted under 35 U.S.C. 154(b) by 134 days.

(21) Appl. No.: 12/694,382

(22) Filed: Jan. 27, 2010

(65) Prior Publication Data
US 2010/0190280 A1    Jul. 29, 2010

(30) Foreign Application Priority Data
Jan. 27, 2009 (JP) ................. 2009-014913

(51) Int. Cl.
*H01L 21/00* (2006.01)
(52) U.S. Cl. ....... 438/28; 438/22; 257/E25.02; 257/E33.001; 257/E33.056

(58) Field of Classification Search ............. 438/22, 438/28; 257/E33.056, E33.001, E25.02; 313/498
See application file for complete search history.

(56) References Cited

U.S. PATENT DOCUMENTS
2008/0036362 A1*    2/2008    Tanimoto et al. ............. 313/498

FOREIGN PATENT DOCUMENTS
| JP | 09120968 A | * | 5/1997 |
| JP | 10144631 A | | 5/1998 |
| JP | 2008521210 T | | 6/2008 |

* cited by examiner

*Primary Examiner* — Charles Garber
*Assistant Examiner* — Abdulfattah Mustapha
(74) *Attorney, Agent, or Firm* — Browdy and Neimark, PLLC

(57) ABSTRACT

A manufacturing method of an LED comprises attaching an LED epitaxial wafer (LED wafer) to an expanding tape, dicing the LED wafer on the expanding tape longitudinally and laterally to a certain element size to divide into a plurality of LED elements, expanding the expanding tape to a certain size to form an enlarged expanding tape, placing respective pairs of element electrodes of the plurality of LED elements that are attached to the enlarged expanding tape on respective pairs of electrodes on a printed-circuit board assembly collectively to perform a bonding, and removing the enlarged expanding tape from the plurality of the LED elements.

6 Claims, 8 Drawing Sheets

MANUFACTURING METHOD OF LIGHT-EMITTING DIODE

CROSS REFERENCE TO THE RELATED APPLICATION

The application is based on and claims the priority benefit of Japanese Patent Application No. 2009-14913, filed on Jan. 27, 2009, the entire description of which is incorporated herein by reference.

BACKGROUND OF THE INVENTION

1. Field of the Invention

The present invention relates to a manufacturing method of light-emitting diode, more specifically to a manufacturing method of a light-emitting diode in which a light-emitting diode element is mounted on a substrate.

2. Description of the Related Art

In recent years, there is developed a white light source comprising a blue light-emitting diode element and a fluorescent material that is excited by a portion of blue light emitted from the blue light-emitting diode element, and, as a result, a conventional light source in lighting, automobile lamps, TVs and personal computers is being rapidly replaced by a light-emitting diode (hereinafter referred to as "LED"). Various methods of manufacturing the LED used in these lighting fixtures and electrical appliances are proposed.

As a conventional manufacturing method of LED in which the LED elements are mounted, there is disclosed a manufacturing method in which the LED elements are mounted one by one on a substrate assembly (refer, for example, to pages 6-7 and FIGS. 2-3 of Japanese Unexamined Patent Application Publication No. 2008-521210). This conventional manufacturing method of LED is now described simply on the basis of FIG. 4.

As shown in FIG. 4A, a substrate assembly 51 includes an upper surface 51a provided with a plurality of pairs of upper surface electrodes 52, and a lower surface 51b provided with a plurality of pairs of lower surface electrodes 56. The pairs of upper surface electrodes 52 and the pairs of lower surface electrodes 56 are electrically connected, respectively, by via conductors or through-holes 57 provided inside the substrate assembly 51, and pairs of bumps 53 are respectively formed on the pairs of upper surface electrodes 52.

Next, LED elements 54 are mounted individually on the pairs of bumps 53, as shown in FIG. 4B. Then, as shown in FIG. 4C, a phosphor resin portion 55 is formed on the upper surface of the substrate assembly 56 to cover a plurality of the LED elements 54 that are mounted on each of the pairs of bumps 53 on the substrate assembly 58, and the LED elements and an entire upper surface of the substrate 58 are sealed. Then, subsequent to polishing an upper surface of the phosphor resin portion 55, the phosphor resin portion 55 and the substrate 58 are simultaneously cut using a rotary blade 59, as shown in FIG. 4D, to divide into a plurality of separated LEDs 50, as shown in FIG. 4E.

Meanwhile, as a conventional technology for a manufacturing method of LED with electrode plates formed on opposite sides of LED element to emit light from an end surface (side surface) of the LED, there is disclosed a manufacturing method that directly involves manufacturing processes to divide into a plurality of LED elements diced on an expanding tape (refer, for example, to pages 4-5 and FIGS. 1-8 of Japanese Unexamined Patent Application Publication No. 10-144631). This conventional manufacturing method is now described simply on the basis of FIG. 5.

A lower surface of an LED epitaxial wafer (hereafter referred to as "LED wafer") 1 is attached to a dicing sheet 2, as shown in FIG. 5A, the LED wafer 1 having a pair of element electrodes of anode and cathode, with one of the anode and the cathode formed at an upper surface, and the other of the anode and the cathode formed at a lower surface of the LED wafer 1. Subsequently, as shown in FIG. 5B, the LED wafer 1 is full-cut diced longitudinally and laterally to a desired element size, thereby forming a plurality of LED elements 4 on the dicing sheet 2. Next, as shown in FIG. 5C, the dicing sheet 2 is expanded to a certain size thereby enlarging a space between one another of the LED elements 4, and, as shown in FIG. 5D, an electrode plate 5 is attached by an anisotropically conductive adhesive 6 to the upper surfaces with element electrodes 4a that is one of the anode and the cathode of the LED elements 4.

Next, subsequent to removing the dicing sheet 2 from the LED elements 4, an electrode plate 7 is attached by the anisotropically conductive adhesive 6 to the lower surfaces with element electrodes 4b that is the other of the anode and cathode of the LED elements 4, as shown in FIG. 5E. In addition, as shown in FIG. 5F, a light-transmitting insulator 9 is injected to fill between each of the LED elements 4, and, as shown in FIG. 5G, parts where the electrode plates 5 and 7 and the light-transmitting insulator 9 are positioned are full-cut diced in one direction to divide into a plurality of LEDs 10.

However, in the above-described manufacturing method of LED 10 with electrode plates formed on opposite sides of LED element, a pair of electrode plates 5 and 7 are respectively formed at places that become the upper and lower surfaces (or right and left surfaces) of the individual LED elements, followed by separation into small pieces for supply. Moreover, pulling an outer periphery of the expanding tape is used just to widen the space between the individual elements from the state where the LED wafer 1 is cut into the plurality of LED elements 4 on the expanding tape. There is thus a problem that, although dicing into individual LED elements 4 allows the plurality of LED elements 4 having the pair of electrode plates formed on the upper and lower surfaces (or right and left surfaces) to be obtained, the LED elements 4 are then mounted one by one on substrates, and it requires a high degree of precision to individually place the respective electrode plates of the LED elements 4 on electrodes of the substrate, leading to an increase in mounting time.

SUMMARY OF THE INVENTION

An object of the present invention is to provide a manufacturing method of LED, in which a plurality of LED elements are collectively mounted on a printed-circuit board assembly and provide a plurality of LEDs at one time.

To achieve the above-described object, a manufacturing method of LED in accordance with an aspect of the present invention includes an attaching-wafer-to-tape step; attaching a first surface of a light-emitting diode epitaxial wafer to an expanding tape, the first surface that is opposite to a second surface of the wafer, and the second surface that is provided with a plurality of element electrodes, a dicing-wafer-step; dicing the wafer longitudinally and laterally to divide into a plurality of light-emitting diode elements each of a certain size with a pair of the element electrodes, in a state that each of the light-emitting diode elements has its first surface attached to the expanding tape, an expanding-tape step; expanding the expanding tape in a state that each of the diced light-emitting diode elements is attached to the expanding tape, thereby forming a certain space between one another of the diced light-emitting diode elements, a bonding-electrodes step; placing the respective pairs of the element electrodes of the plurality of light-emitting diode elements on a printed-circuit board assembly provided with a plurality of pairs of electrodes, such that each pair of the element electrodes faces and is bonded to each pair of electrodes on the printed-circuit board assembly; a removing-tape step; removing the expanding tape from the light-emitting diode elements each bonded to the corresponding pair of the electrodes on the printed-circuit board.

At the bonding-electrodes step, the each pair of the element electrodes of the light-emitting diode elements and the each corresponding pair of the electrodes on the printed-circuit board assembly may be collectively bonded at one time. Also, at the bonding-electrodes step, a provisional bonding may be performed with a bonding strength that allows the subsequent removing-tape step in a state that the each pair of the light-emitting diode elements are kept bonded to the each corresponding pair of the electrodes on the printed-circuit board assembly. In this case, a main bonding step may be performed subsequent to the tape-removing step.

Furthermore, the manufacturing method of LED includes a forming-light-transmitting-resin step subsequent to the tape-removing step. At this forming-light-transmitting-resin step, the light-transmitting portion that collectively covers the LED elements on the circuit-board assembly and the light-transmitting resin portion and the printed-circuit board assembly are full-cut-diced longitudinally and laterally to divide into a plurality of individual LEDs.

At the forming-light-transmitting-resin step, a light-transmitting resin sheet including a fluorescent material may be disposed on upper surfaces of the LED elements. The light-transmitting resin may be heated to melt to cover upper and side surfaces of the LED elements. As a result, a fluorescent-resinous layer is collectively formed on an upper surface and side surfaces of each of the LED elements.

In the manufacturing method of LED in the present invention, the respective pairs of element electrodes positioned at second surfaces of the plurality of LED elements that are attached at their first surfaces onto the expanded enlarged expanding tape are collectively mounted on the respective pairs of the electrodes on the printed-circuit board assembly, and therefore, it is possible to mount the plurality of LED elements collectively on the printed-circuit board assembly.

Moreover, since the LED elements mounted on the printed-circuit board assembly are divided after the light-transmitting portion is collectively formed to cover the LED elements, a foreign matter such as dust can be prevented from attaching to the LED elements.

BRIEF DESCRIPTION OF THE DRAWINGS

FIG. 5A is a cross-sectional view of a state in which an LED wafer having element electrodes located respectively on a first surface and on a second surface opposing the first surface, has a dicing sheet attached to the first surface in another example of a conventional manufacturing method of.

DETAILED DESCRIPTION OF THE PREFERRED EMBODIMENTS

Embodiments of a manufacturing method of an LED in accordance with the present invention are now described in detail with reference to the accompanying drawings.

Figure 2:
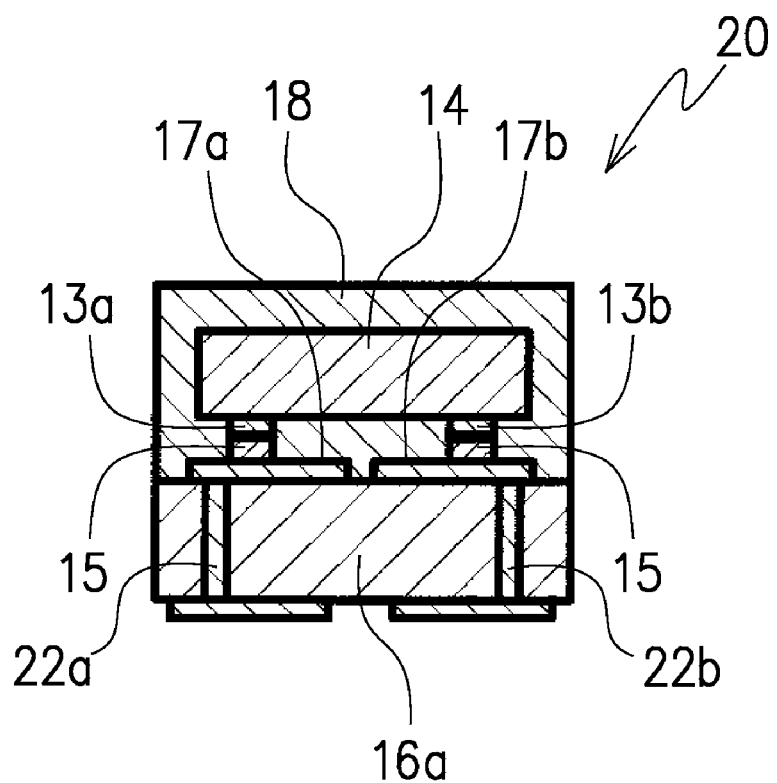
FIG. 2 is a cross-sectional view of the individual LED manufactured in an embodiment of the present invention.

First, an embodiment of the manufacturing method of LED in the present invention is described. FIG. 2 shows an LED 20 in which an LED element 14 is mounted on the printed-circuit board 16a. For more details, anode and cathode element electrodes 13a and 13b that are formed at one surface of the LED element 14 are electrically connected through bumps 15 to a pair of electrodes 17a and 17b that are formed on the printed-circuit board 16a, respectively. The pair of electrodes 17a and 17b of the printed-circuit board 16a include a pair of upper electrodes formed on an upper surface of the printed-circuit board 16a and a pair of lower electrodes formed on a lower surface of the printed-circuit board 16a, and through-holes 22a and 22b that electrically connect the upper and lower electrodes, respectively. In addition, in FIG. 2, the LED element 14 and the bumps 15 are sealed by a light-transmitting resin 18 that is formed on an upper surface of the printed-circuit board 16. The light-transmitting resin may include a fluorescent material.

Figure 1A:
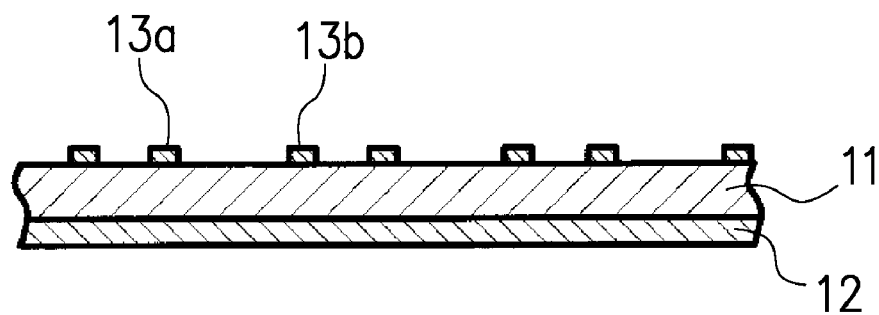
FIG. 1A is a cross-sectional view showing an attaching-wafer-to-tape step in which a first surface of an LED wafer is attached to an expanding tape and a plurality of pairs of element electrodes are shown on a second surface of the LED wafer in an embodiment of the present invention.

Next, a manufacturing method of LED 20 having the above-described configuration is described. First, an LED epitaxial wafer (hereafter referred to as "LED wafer") 11 having a surface at which a pair of anode and cathode element electrodes are positioned (active area) and an opposing surface that is opposite to the active area. Hereinafter, the opposing surface is mentioned as a first surface, and the active area where element electrodes are located is mentioned as a second surface to clarify descriptions. The first surface of the LED wafer is attached onto an expanding tape 12 with the second surface that is provided with pairs of anode and cathode element electrodes 13a and 13b facing upward, as shown in FIG. 1A.

Figure 1B:
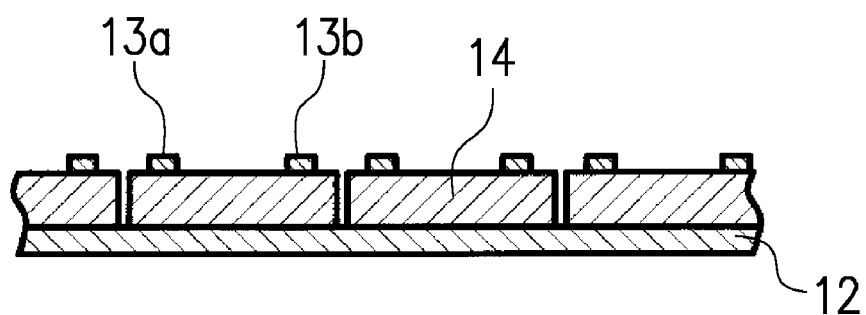
FIG. 1B is a cross-sectional view showing a dicing-wafer-step in which the LED wafer on the expanding tape is diced to divide into a plurality of LED elements each of a certain size with a pair of the element electrodes in the embodiment of the present invention.

Next, the LED wafer 11 with the first surface attached onto the expanding tape 12 is full-cut diced longitudinally and laterally to divide into a plurality of LED elements each of a certain size with a pair of anode and cathode element electrodes, as shown in FIG. 1B. Used in the full-cut dicing is, for example, a diamond blade. Note that the plurality of LED elements 14 obtained by performing the full-cut dicing of the LED wafer 11 remain attached to the expanding tape 12.

Figure 1C:
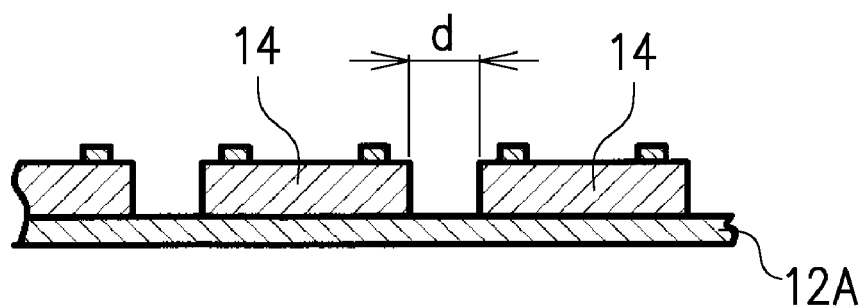
FIG. 1C is a cross-sectional view showing an expanding-tape step in which the expanding tape is expanded to enlarge a space between one another of the diced LED elements in the embodiment of the present invention.

Next, the expanding tape 12 to which first surfaces (that correspond to the first surface of the LED wafer) of the LED elements 14 each remain attached is expanded, as shown in FIG. 1C. At this time, the expanding tape 12 is enlarged to become an enlarged expanding tape 12A, and as a result, a space d between one another of the diced LED elements 14 is enlarged proportionately. Accordingly, positions of respective pairs of anode and cathode element electrodes are adjusted on the enlarged expanding tape 12A to face positions of the respective pairs of electrodes disposed on the printed-circuit board assembly 16 to be described hereafter at a bonding-electrodes step.

Figure 1D:
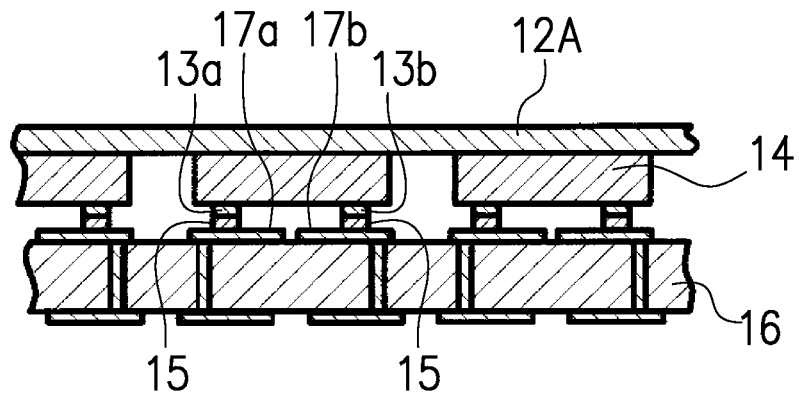
FIG. 1D is a cross-sectional view showing a bonding-electrodes step in which respective pairs of the element electrodes positioned at second surfaces of the LED elements that have their first surfaces attached to the enlarged expanding tape are collectively placed on respective pairs of electrodes of a printed-circuit board assembly to perform a bonding in the embodiment of the present invention.

Next, at a bonding-electrodes step as shown in FIG. 1D, a plurality of pairs of the bumps 15 are formed corresponding to upper surfaces of a plurality of pairs of the electrodes 17a and 17b on the printed-circuit board assembly 16, with one of the electrodes 17a and 17b in each pair, that is, the one facing the anode element electrode, being positive, and the other of the electrodes 17a and 17b in each pair, that is, the other facing the cathode element electrode, being negative. In other words, respective pairs of the element electrodes are placed on respective pairs of the electrodes on the printed-circuit board assembly 16 through respective bumps 15, and respective pairs of the element electrodes face and are bonded to respective pairs of electrodes on a printed-circuit board.

The bumps 15 disposed between the respective element electrodes of the LED elements and respective electrodes of the printed-circuit board are welded by ultrasonic waves, thereby performing a bonding, for example. In this case, ultrasonic waves are applied at 150° C. for a period of about several seconds, and in the case of using a thermal pressure bonding process, heat of about 300° C. is applied for a period of about several minutes. This method results in that the respective pairs of the element electrodes positioned at respective second surfaces (that correspond to the second surface of the LED wafer) of the plurality of LED elements 14 are collectively bonded to the respective pairs of the electrodes 17a and 17b on the printed-circuit board assembly 16, while the first surfaces of the LED elements 14 are still attached to the expanding tape 12.

Furthermore, gold (Au), eutectic solder (Au—Sn), Pb—Sn, lead-free solder and the like can be used as a material for the bumps 15. Note that the present embodiment at the bonding-electrodes step is described as cases using bumps made from gold (Au) for ultrasonic waves and using bumps made from eutectic solder (Au—Sn) for the thermal pressure bonding. Moreover, a glass epoxy substrate assembly may be adopted as the printed-circuit board assembly 16, and a silicone substrate assembly may also be used as the printed-circuit board assembly 16. The silicone substrate assembly may be desirable because it has good thermal conductivity and excels in cooling effect of the LED element. In addition, it is possible to use a heat-resistant sheet constituted by polyimide, for example, for the expanding tape.

The above-explained embodiment includes a bonding that is just one-time bonding performed before the expanded tape is removed from the LED elements. That is, the bonding process is performed on a single occasion in this embodiment.

Figure 1E:
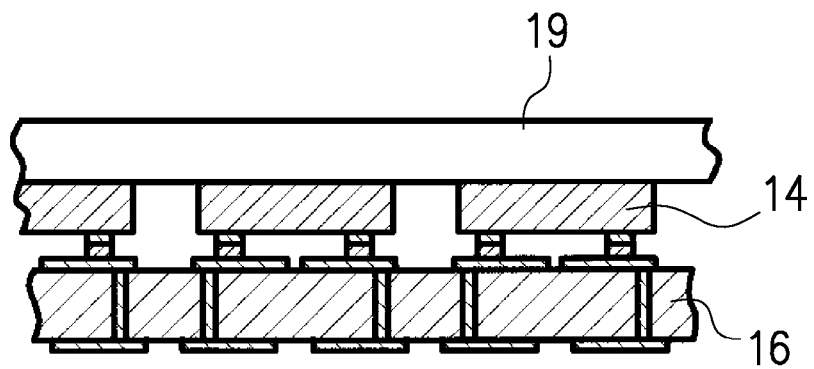
FIG. 1E is a cross-sectional view in which, in the case that FIG. 1D is assumed to be a provisional bonding, a main bonding is further provided subsequent to the removing-tape step, and the plurality of LED elements are re-applied with ultrasonic waves to perform the main bonding to the corresponding pairs of electrodes on the printed-circuit board assembly in another embodiment of the present invention.

In a separate embodiment, it is also possible to perform bonding twice, in accordance with conditions of the expanding tape. As shown in FIG. 1E, subsequent to removing the enlarged expanding tape 12A from the LED elements, for example, ultrasonic waves from an ultrasonic head 19 are re-applied to weld the bumps 15, thereby performing a main bonding of each of the LED elements 14 onto the printed-circuit board assembly 16 collectively. In the case of two-time bonding process, it is possible for the provisional bonding to be performed at a low temperature since the bonding here only needs a strength that allows removing the expanding tape from the LED elements bonded on the electrodes of the printed-circuit substrate to be withstood, and, subsequent to the removing of the expanding tape, for the main bonding to be performed at a higher temperature, whereby the bonding can be performed on two separate occasions. In this embodiment likewise, the plurality of LED elements 14 are collectively joined electrically and mechanically to the printed-circuit board assembly 16 to be flip-chip mounted thereon.

Figure 1F:
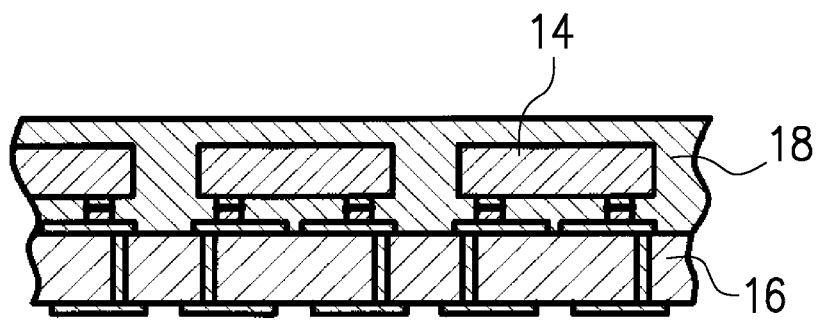
FIG. 1F is a cross-sectional view showing a forming-light-transmitting-resin step in which a light-transmitting resin portion is formed on the printed-circuit board assembly to collectively seal the plurality of LED elements in the embodiment of the present invention.

As shown in FIG. 1F, the light-transmitting resin portion 18 is formed on an upper surface of the printed-circuit board assembly 16 subsequent to the removing-tape step. This light-transmitting resin portion 18 includes a light-transmitting insulating material such as silicone resin, epoxy resin or the like.

The light-transmitting resin portion 18 may contain a fluorescent material that absorbs a part of light emitted from the LED element 14 and emits converted light. The light-transmitting resin is injected to seal LED elements 14 on the upper surface of the printed-circuit board assembly 16 and then cured. A fluorescent material is, for example, YAG, a nitride, an oxynitride and the like. Moreover, the light-transmitting insulating material is subject to no particular limitations other than it be light-transmitting, and a silicone resin, an epoxy resin, a urea resin, a fluorine resin and the like can be used therefor.

Figure 1G:
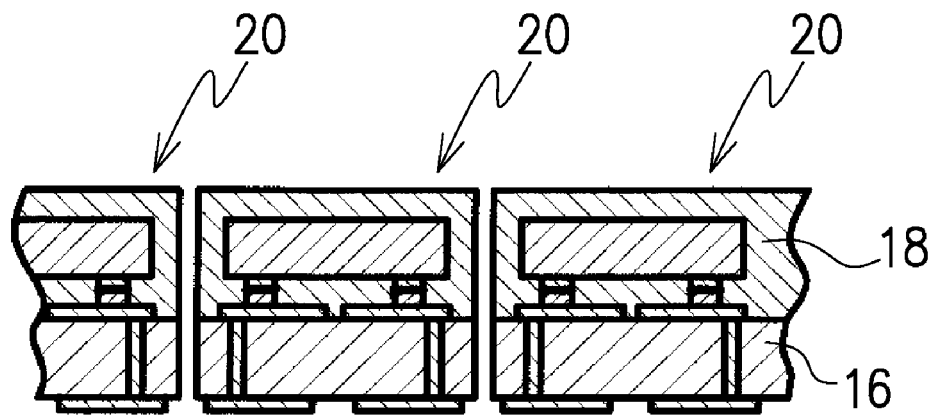
FIG. 1G is a cross-sectional view showing a full-cut-dicing step in which the printed-circuit board assembly and the light-transmitting resin portion are diced to divide into a plurality of individual LEDs in the embodiment of the present invention.

Concluding the manufacturing processes, at the full-cut dicing step the printed-circuit board assembly 16 and the light-transmitting resin portion 18 are full-cut diced longitudinally and laterally at certain positions using a diamond blade to divide into a plurality of individual LEDs 20, as shown in FIG. 1G.

Figure 3A:
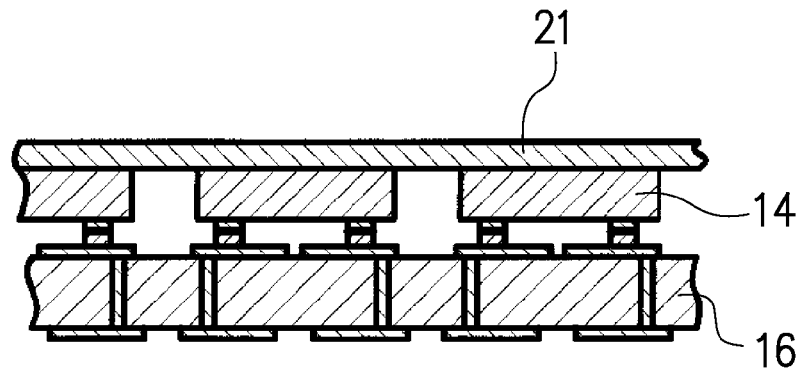
FIG. 3A is a cross-sectional view showing the forming-light-transmitting-resin step in which a light-transmitting resin sheet that contains a fluorescent material is disposed on upper surfaces of the plurality of LED elements subsequent to the removing-tape step in another embodiment of the present invention.
Figure 3B:
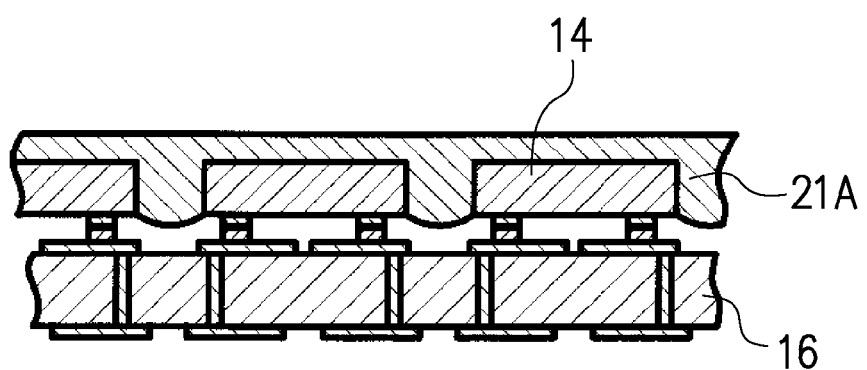
FIG. 3B is a cross-sectional view showing the light-transmitting-resin-forming step in which the light-transmitting resin sheet is softened by heating to cover upper surfaces and side surfaces of the LED elements to form the fluorescent layer of the light-transmitting resin in another variation embodiment of the present invention.

FIG. 3 shows another embodiment showing the forming-light-transmitting-resin step when a light-transmitting sheet that includes a fluorescent material is used in formation of the light-transmitting resin portion 18. In a manufacturing method of an LED in accordance with this embodiment, manufacturing processes up to the removing-tape step are identical to those of the previous embodiment.

Subsequent to the bonding-electrodes step, a light-transmitting resin sheet containing a fluorescent material 21 is disposed on upper surfaces of the LED elements 14, the upper surfaces being first surfaces that correspond positionally to the first surface of the LED wafer, and lower surfaces being second surfaces that are provided with respective pairs of element electrodes and correspond positionally to the second surface of the LED wafer.

Figure 3C:
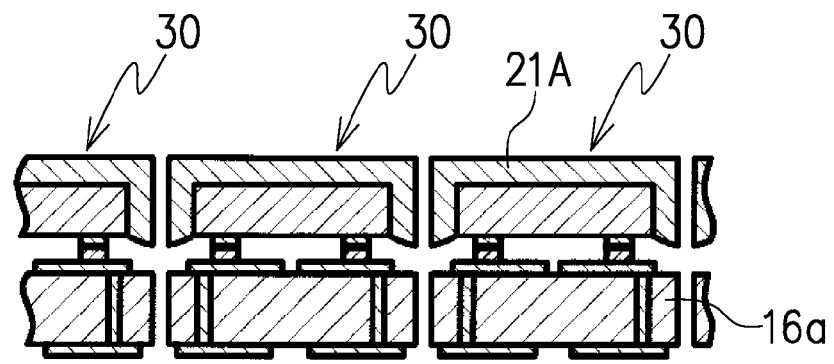
FIG. 3C is a cross-sectional view showing a full-cut dicing step in which the printed-circuit board assembly and the light-transmitting resin portion that contains the fluorescent material and covering upper and side surfaces of the LED elements are full-cut diced to divide into individual LEDs in another variation embodiment of the invention.
Figure 4A:
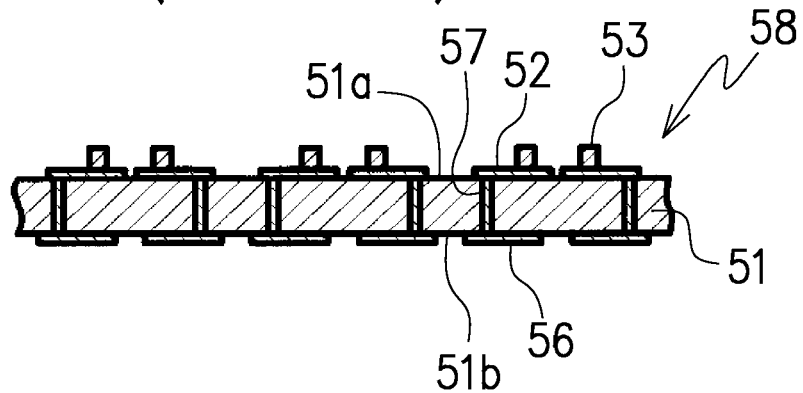
FIG. 4A is a cross-sectional view of a state in which a plurality of pairs of bumps are formed on conductive pairs of electrodes formed on a surface of a circuit board assembly in an example of a conventional manufacturing method of LED.
Figure 4B:
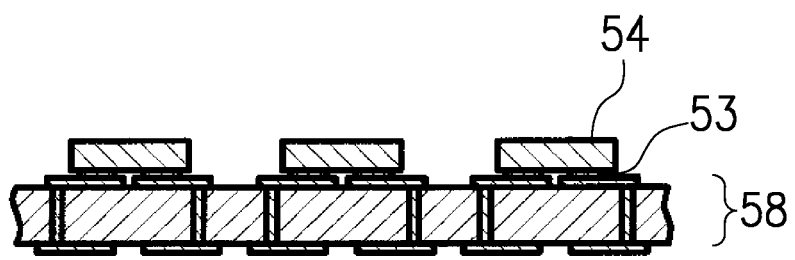
FIG. 4B is a cross-sectional view of a state in which LED elements are individually mounted on the pairs of bumps in the example of a conventional manufacturing method of LED.
Figure 4C:
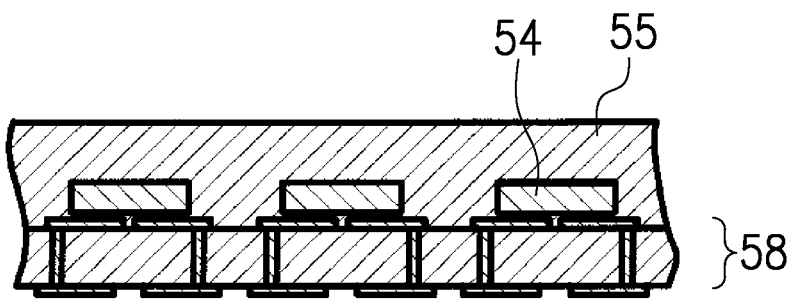
FIG. 4C is a cross-sectional view of a state in which a phosphor resin portion is formed on the substrate to collectively seal the plurality of LED elements in the example of a conventional manufacturing method.
Figure 4D:
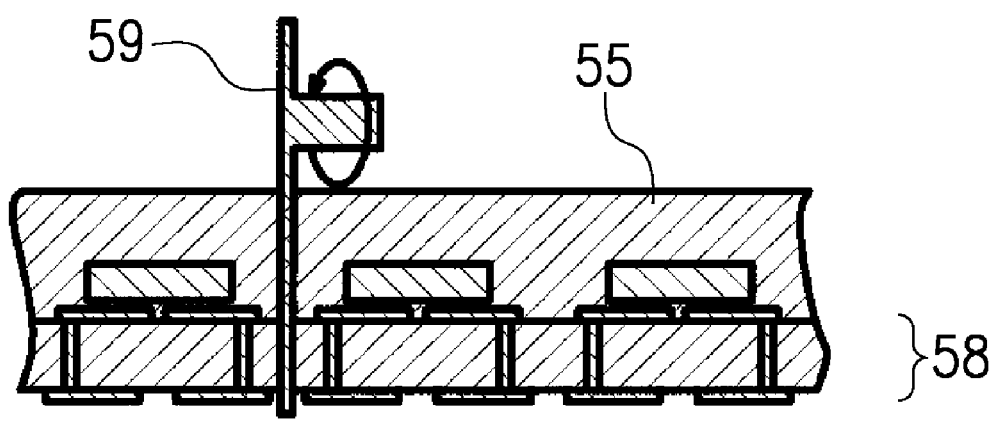
FIG. 4D is a cross-sectional view of a state in which the phosphor resin portion and the substrate are simultaneously cut using a rotary blade in the example of a conventional manufacturing method.
Figure 4E:
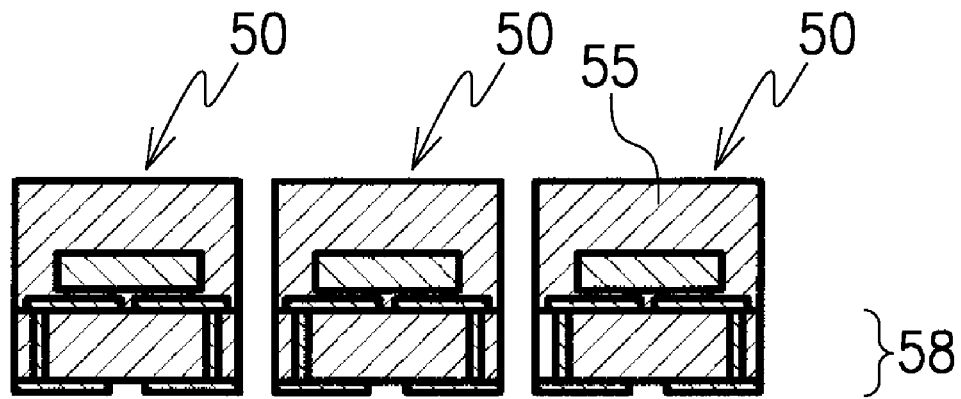
FIG. 4E is a cross-sectional view showing a state in which LEDs separated by cutting the phosphor resin portion and the substrate are formed in the example of a conventional manufacturing method.
Figure 5A:
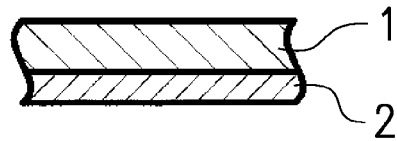
Figure 5B:
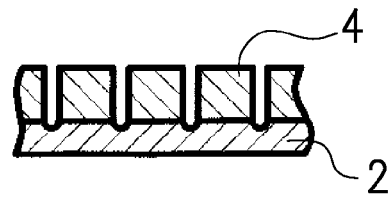
FIG. 5B is a cross-sectional view of a state in which the LED wafer is diced to divide into a plurality of LED elements that are attached to the dicing sheet in the other example of a conventional manufacturing method.
Figure 5C:
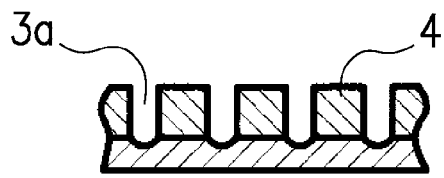
FIG. 5C is a cross-sectional view of a state in which the dicing sheet is expanded to enlarge a space between one another of the LED elements in the other example of a conventional manufacturing method.
Figure 5D:
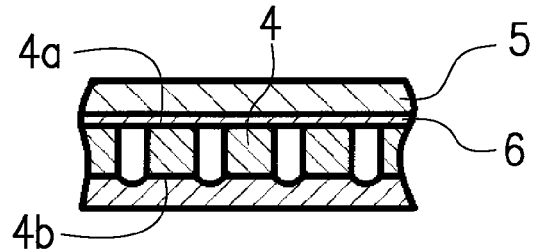
FIG. 5D is a cross-sectional view of a state in which an electrode plate is attached to the diced second surface that are second surfaces of the diced LED elements, and the diced first surface that are first surfaces of the diced LED elements is attached to the dicing sheet in the other example of a conventional manufacturing method.
Figure 5E:
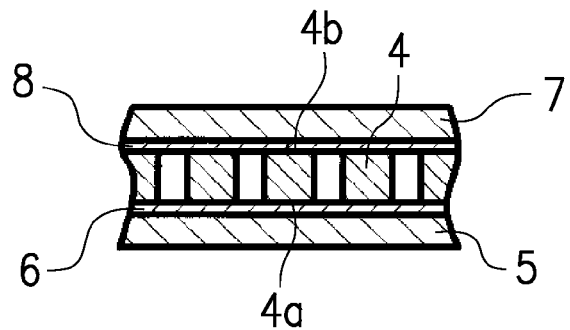
FIG. 5E is a cross-sectional view of a state in which an electrode plate is attached to the first surface that are first surfaces of the diced LED elements in the other example of a conventional manufacturing method.
Figure 5F:
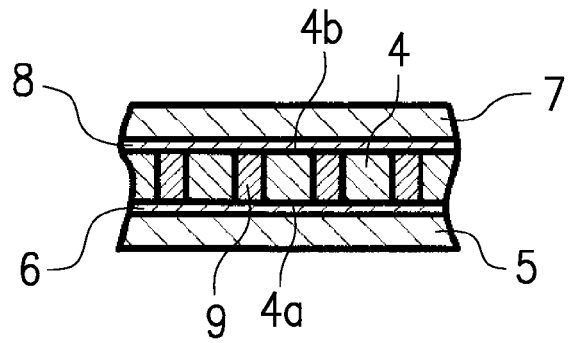
FIG. 5F is a cross-sectional view of a state in which a light-transmitting insulator is injected to fill the spaces between each of the LED elements in the other example of a conventional manufacturing method.
Figure 5G:
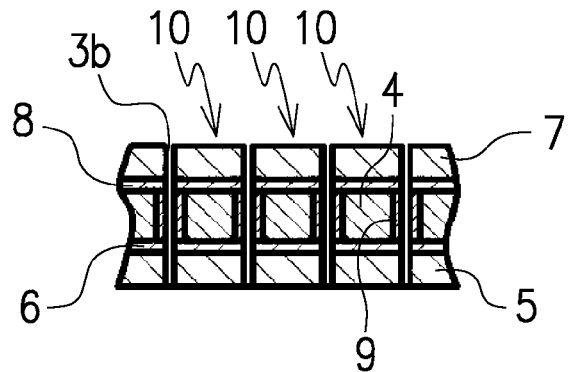
FIG. 5G is a cross-sectional view of a state in which the electrode plates and the light-transmitting insulator are full-cut diced to divide into individual LEDs in the other example of a conventional manufacturing method of LED.

Next, the light-transmitting sheet 21 is heated to melt to cover the upper surfaces and side surfaces of the LED elements 14. As a result, the light-transmitting portion 21A that is a fluorescent resin layer is formed on the upper and side surfaces of each of the LED elements. Then, the printed-circuit board assembly 16 and the light-transmitting resin portion 21A are full-cut diced longitudinally and laterally at certain positions using a diamond blade to divide into a plurality of individual LEDs 30 in each of which an LED element 14 is electrically mounted on a printed-circuit board 16a and a fluorescent resin layer is formed on upper and side surfaces of the LED element 14, as shown in FIG. 3C.

As described above, the present invention enables the plurality of LED elements 14 to be collectively mounted on the respective pairs of electrodes of the printed-circuit board assembly 16 by using an expanding tape and performing the bonding of the plurality of LED elements 14 onto the corresponding pairs of electrodes on the printed-circuit board 16 collectively.

Furthermore, adopting the light-transmitting resin containing a fluorescent material 21 in a shape of a sheet to form the fluorescent resinous portion makes it possible to form the fluorescent layer only on the upper surface and side surfaces of the LED elements and that prevents unnecessary fluorescent resinous portion from being formed on the upper surface and electrodes of the printed-circuit board in a completed product. This makes it possible to realize a manufacturing method of an LED that has a short assembly time while maintaining high brightness characteristics.

The LED manufactured by the manufacturing method in the present invention can be widely utilized in general lighting, automobile lamps, televisions, personal computers, mobile terminal devices such as mobile telephones, and the like.

What is claimed is:

1. A manufacturing method of light-emitting diode, comprising:
   an attaching-wafer-to-tape step; attaching a first surface of a light-emitting diode epitaxial wafer to an expanding tape, the first surface being opposite to a second surface of the wafer, and the second surface being provided with a plurality of element electrodes,
   a dicing-wafer-step; dicing the wafer longitudinally and laterally to form a plurality of light-emitting diode elements each of a certain size with a pair of the element electrodes, in a state that each of the light-emitting diode elements is attached to the expanding tape,
   an expanding-tape step; expanding the expanding tape in a state that each of the diced light-emitting diode elements is attached to the expanding tape, thereby forming a certain space between one another of the diced light-emitting diode elements,
   a bonding-electrodes step; laying the expanded expanding tape with the plurality of light-emitting diode elements attached over a plurality of pairs of electrodes that are disposed on a printed-circuit board assembly, to electrically dispose each pair of the element electrodes of the plurality of light-emitting diode elements on each pair of the plurality of pairs of electrodes disposed on the printed-circuit board assembly, such that each pair of the element electrodes of the plurality of light-emitting diode elements faces and is bonded to each pair of electrodes disposed on the printed-circuit board assembly; and
   a removing-tape step; removing the expanding tape from the light-emitting diode elements each bonded to the corresponding pair of the electrodes on the printed-circuit board.

2. The manufacturing method of light-emitting diode according to claim 1,
   wherein the bonding at the bonding-electrodes step is a provisional bonding performed with a bonding strength that allows the subsequent removing-tape step in a state that the each pair of the light-emitting diode elements are kept bonded to the each corresponding pair of the electrodes on the printed-circuit board assembly,
   and further comprising:
   a main bonding step; bonding firmly the each pair of the element electrodes of the plurality of light-emitting diode elements to the each corresponding pair of the electrodes on the printed-circuit board assembly, subsequent to the removing-tape step.

3. The manufacturing method of light-emitting diode according to claim 1,
wherein at the bonding-electrodes step, the each pair of the element electrodes of the light-emitting diode elements and the each corresponding pair of the electrodes on the printed-circuit board assembly are collectively bonded at one time.

4. The manufacturing method of light-emitting diode according to claim 1, further comprising:
a forming-light-transmitting-resin step; forming a light-transmitting resin portion that collectively covers the plurality of light-emitting diode elements on the printed-circuit board assembly, subsequent to the removing-tape step, and
a full-cut dicing step; full-cut dicing the light-transmitting resin portion and the printed-circuit board assembly longitudinally and laterally to divide into a plurality of individual light-emitting diodes.

5. The manufacturing method of light-emitting diode according to claim 1,
wherein, at the electrodes-bonding step, an anode electrode and a cathode electrode of the each pair of the element electrodes are bonded to an anode electrode and a cathode electrode of the each pair of the electrodes on the printed-circuit board assembly by a pair of bumps.

6. The manufacturing method of light-emitting diode according to claim 1, further comprising:
a forming-light-transmitting-resin step; disposing the light-transmitting sheet that includes a fluorescent material on upper surfaces of the light-emitting diode elements, and then heating the light-transmitting sheet that includes the fluorescent material to melt to cover the upper surfaces and side surfaces of the light-emitting diode elements to form a fluorescent light-transmitting layer on the upper surfaces and side surfaces of the light-emitting diode elements, and
a full-cut dicing step; full-cut dicing the light-transmitting layer and the printed-circuit board assembly longitudinally and laterally to divide into a plurality of light-emitting diodes.

* * * * *